United States Patent
Urakawa et al.

(10) Patent No.: US 9,870,898 B2
(45) Date of Patent: Jan. 16, 2018

(54) PLASMA PROCESSING METHOD AND PLASMA PROCESSING APPARATUS

(71) Applicant: Tokyo Electron Limited, Tokyo (JP)

(72) Inventors: Masafumi Urakawa, Miyagi (JP); Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/018,981

(22) Filed: Feb. 9, 2016

(65) Prior Publication Data

US 2016/0247666 A1   Aug. 25, 2016

(30) Foreign Application Priority Data

Feb. 23, 2015   (JP) ................................. 2015-032953

(51) Int. Cl.
  H01J 37/32   (2006.01)
(52) U.S. Cl.
  CPC .. H01J 37/32146 (2013.01); H01J 37/32174 (2013.01); H01J 37/32568 (2013.01); H01J 37/32715 (2013.01)
(58) Field of Classification Search
  None
  See application file for complete search history.

(56) References Cited

U.S. PATENT DOCUMENTS

| | | | | |
|---|---|---|---|---|
| 8,153,519 B1* | 4/2012 | Yu | ...................... | H01L 21/0337 257/E21.577 |
| 8,263,496 B1* | 9/2012 | Wodecki | ........... | H01L 21/31116 216/22 |
| 9,209,034 B2* | 12/2015 | Kitamura | .......... | H01J 37/32091 |
| 9,614,524 B1* | 4/2017 | Kawasaki | .......... | H03K 19/0005 |
| 2002/0160125 A1* | 10/2002 | Johnson | ............ | H01J 37/32082 427/569 |
| 2009/0047795 A1* | 2/2009 | Matsudo | ........... | H01J 37/32091 438/729 |
| 2010/0130018 A1* | 5/2010 | Tokashiki | ......... | H01J 37/32082 438/710 |
| 2010/0248488 A1* | 9/2010 | Agarwal | ........... | H01J 37/32091 438/714 |
| 2011/0031216 A1* | 2/2011 | Liao | .................. | H01J 37/32082 216/67 |
| 2011/0143537 A1* | 6/2011 | Lee | ................... | H01J 37/32082 438/669 |

(Continued)

FOREIGN PATENT DOCUMENTS

JP   2012-009544   1/2012

*Primary Examiner* — Allan Olsen
(74) *Attorney, Agent, or Firm* — IPUSA, PLLC (57) ABSTRACT

A plasma processing method includes applying a pulse wave of high frequency electric power for plasma generation and a pulse wave of high frequency electric power for bias whose frequency is lower than that of the high frequency electric power for plasma generation on the mounting table; and controlling the pulse wave of the high frequency electric power for plasma generation and the pulse wave of the high frequency electric power for bias such that a predetermined phase difference is generated between the pulse wave of the high frequency electric power for plasma generation and the pulse wave of the high frequency electric power for bias, and a duty ratio of the high frequency electric power for plasma generation becomes greater than or equal to a duty ratio of the high frequency electric power for bias.

4 Claims, 10 Drawing Sheets

(56) References Cited

U.S. PATENT DOCUMENTS

| Publication No. | Date | Name | Classification | Subclass |
|---|---|---|---|---|
| 2011/0318933 A1* | 12/2011 | Yatsuda | H01J 37/32091 | 438/712 |
| 2013/0008867 A1* | 1/2013 | Tokashiki | B82Y 40/00 | 216/22 |
| 2013/0105443 A1* | 5/2013 | Banna | H01L 21/31116 | 216/67 |
| 2013/0149499 A1* | 6/2013 | Lee | H01L 43/12 | 428/156 |
| 2013/0270997 A1* | 10/2013 | Zhao | H05H 1/46 | 315/34 |
| 2014/0235062 A1* | 8/2014 | Urakawa | H01L 21/31116 | 438/714 |
| 2014/0305905 A1* | 10/2014 | Yamada | H01J 37/32091 | 216/71 |
| 2014/0361690 A1* | 12/2014 | Yamada | H01J 37/32091 | 315/111.21 |
| 2015/0000841 A1* | 1/2015 | Yamada | H01J 37/32183 | 156/345.28 |
| 2015/0000842 A1* | 1/2015 | Hirano | G05B 11/01 | 156/345.28 |
| 2015/0056808 A1* | 2/2015 | Ogasawara | H01L 21/31116 | 438/694 |
| 2015/0096684 A1* | 4/2015 | Nagami | H01J 37/32146 | 156/345.28 |
| 2016/0079037 A1* | 3/2016 | Hirano | H01J 37/32146 | 156/345.28 |
| 2016/0087075 A1* | 3/2016 | Zhang | H01L 21/823437 | 257/412 |
| 2016/0163563 A1* | 6/2016 | Yoshida | H01L 21/0271 | 438/725 |
| 2017/0062186 A1* | 3/2017 | Coumou | H01J 37/32155 | |
| 2017/0098527 A1* | 4/2017 | Kawasaki | H01J 37/32091 | |
| 2017/0099722 A1* | 4/2017 | Kawasaki | H05H 1/46 | |
| 2017/0103873 A1* | 4/2017 | Kawasaki | H01J 37/32183 | |

* cited by examiner

PLASMA PROCESSING METHOD AND PLASMA PROCESSING APPARATUS

CROSS-REFERENCE TO RELATED APPLICATION

The present application is based on and claims the benefit of priority of Japanese Priority Application No. 2015-032953 filed on Feb. 23, 2015, the entire contents of which are hereby incorporated by reference.

BACKGROUND OF THE INVENTION

1. Field of the Invention

The present invention relates to a plasma processing method and a plasma processing apparatus.

2. Description of the Related Art

A plasma processing apparatus is known which includes a high frequency power source for providing high frequency electric power for plasma generation and a high frequency power source for providing high frequency electric power for bias, and performs a plasma process on a substrate by forming plasma from gas by these high frequency electric powers (see Patent Document 1, for example). According to Patent Document 1, high frequency electric power for plasma generation and high frequency electric power for bias are applied to a mounting table.

When performing a plasma process, the above described two high frequency electric powers are superimposed and a standing wave is generated by a high harmonics wave component of each of the high frequency electric powers. Due to generation of the standing wave, electric field at a center portion of a substrate may become higher than electric field at an edge portion or an area between the center portion and the edge portion (hereinafter referred to as a "middle portion" as well) of the substrate.

In such a case, an etching rate (hereinafter simply referred to as "ER" as well) becomes higher at the center portion of the substrate compared with the middle portion or the edge portion of the substrate. When the etching rate becomes uneven as such, process sizes of Critical Dimension (CD) or etching depths at the center portion and areas other than the center portion vary, and it becomes difficult to perform a uniform plasma process on the substrate.

PATENT DOCUMENT

[Patent Document 1] Japanese Laid-open Patent Publication No. 2012-9544

SUMMARY OF THE INVENTION

The present invention is made in light of the above problems, and provides a technique to suppress generation of a standing wave of a plurality of high frequency electric powers applied in a process chamber of a plasma processing apparatus.

According to an embodiment, there is provided a plasma processing method using a plasma processing apparatus including a process chamber, a mounting table provided in the process chamber, and an electrode provided to face the mounting table, of plasma processing a substrate on the mounting table. The method includes applying a pulse wave of high frequency electric power for plasma generation and a pulse wave of high frequency electric power for bias whose frequency is lower than that of the high frequency electric power for plasma generation on the mounting table; and controlling the pulse wave of the high frequency electric power for plasma generation and the pulse wave of the high frequency electric power for bias such that such that a predetermined phase difference is generated between the pulse wave of the high frequency electric power for plasma generation and the pulse wave of the high frequency electric power for bias, and a duty ratio of the high frequency electric power for plasma generation becomes greater than or equal to a duty ratio of the high frequency electric power for bias.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

(Overall Structure of Plasma Processing Apparatus)

Figure 1:
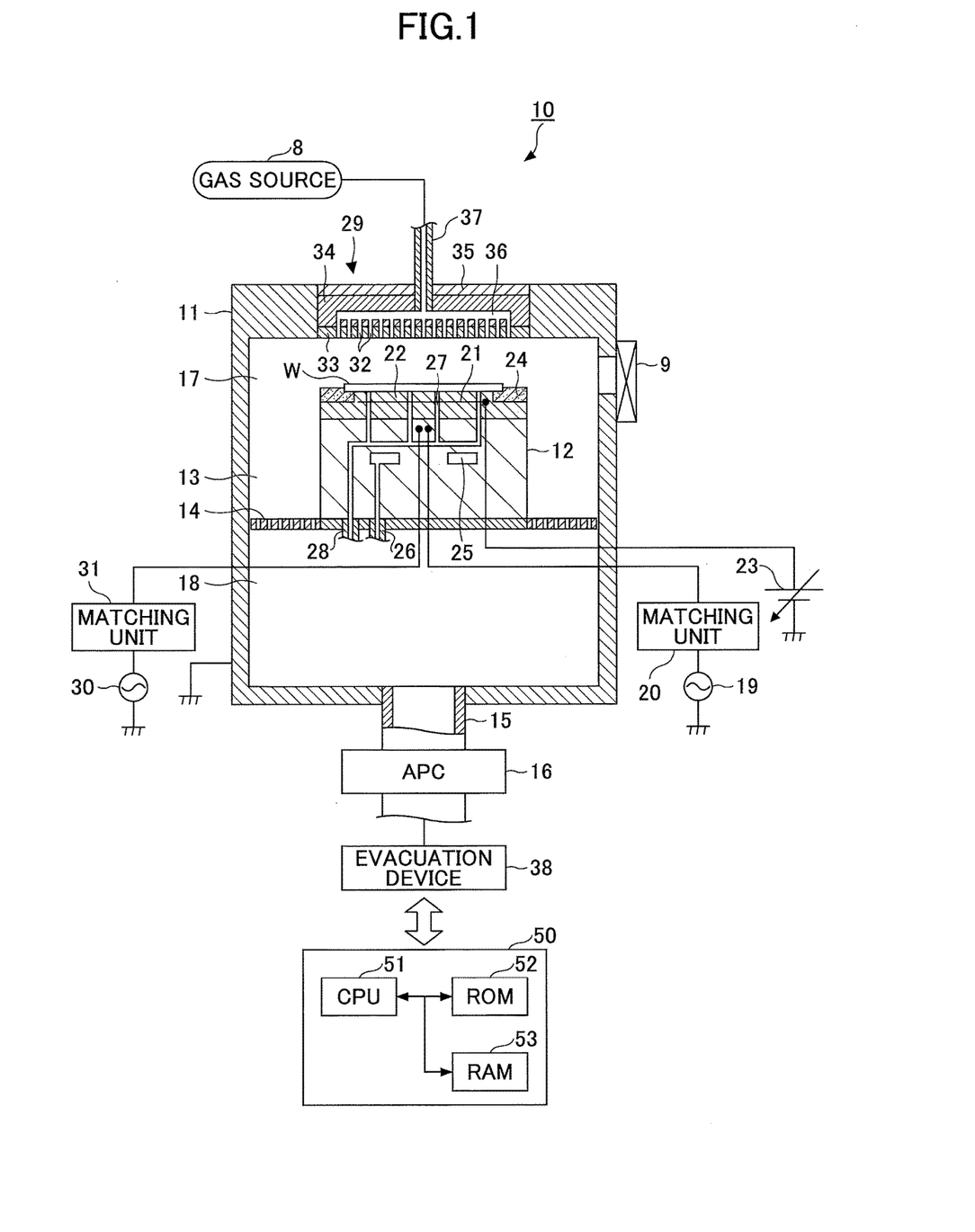
FIG. 1 is a vertical cross-sectional view illustrating an example of a plasma processing apparatus of an embodiment.

First, an overall structure of a plasma processing apparatus 10 of the embodiment is explained with reference to FIG. 1. The plasma processing apparatus 10 includes a gas source 8, a gate valve 9, a tubular process chamber 11, a mounting table 12, an evacuation path 13, an evacuation plate 14, an evacuation device 38, a first high frequency power source 19, a matching unit 20, an electrostatic chuck 22, a DC power 23, a circular focus ring 24, a circular coolant room 25, a gas shower head 29, a matching unit 31, a second high frequency power source 30 and a control unit 50.

The process chamber 11 is made of aluminum or the like and is capable of being sealed. The process chamber 11 is connected to ground potential. The mounting table 12 is made of a conductive material such as aluminum, for example, and is provided inside the process chamber 11. The mounting table 12 is a cylindrical table on which a wafer W is mounted and has a function as a lower electrode as well.

The evacuation path 13, which is a path to evacuate a gas above the mounting table 12 to outside of the process chamber 11, is formed between a side wall of the process chamber 11 and a side surface of the mounting table 12. The evacuation plate 14 is provided in the middle of the evacuation path 13. The evacuation plate 14 is a plate member provided with a plurality of holes, and functions as a partition plate that partitions an upper portion and a lower portion of the process chamber 11. The upper portion of the process chamber 11 partitioned by the evacuation plate 14 is a reaction room 17 in which a plasma process is performed. The evacuation device 38 is connected to an evacuation room (manifold) 18, which is the lower portion of the process chamber 11, via an evacuation pipe 15 that evacuates the gas in the process chamber 11 and an Adaptive Pressure Control (APC) valve 16. The evacuation plate 14 prevents leakage of plasma generated in the reaction room 17 to the evacuation room 18 by catching and reflecting the plasma. The evacuation device 38 depressurizes the process chamber 11 by adjusting the APC valve 16 to maintain the process chamber 11 at a desired vacuum state.

The first high frequency power source 19 is connected to the mounting table 12 via the matching unit 20, and provides high frequency electric power for plasma excitation (hereinafter, referred to as "HF" (high frequency) as well) of about 40 MHz, for example, to the mounting table 12. The matching unit 20 suppresses reflection of the high frequency electric power from the mounting table 12 to make the providing efficiency of the high frequency electric power for plasma excitation HF maximum.

The second high frequency power source 30 is connected to the mounting table 12 via the matching unit 31, and provides high frequency electric power for bias (hereinafter, referred to as "LF" (low frequency) as well) of 400 kHz to 13.56 MHz, for example, to the mounting table 12. The matching unit 31 suppresses reflection of the high frequency electric power from the mounting table 12 to make the providing efficiency of the high frequency electric power for bias LF maximum.

The electrostatic chuck 22 includes its inside an electrostatic electrode plate 21 and is placed on the upper portion of the mounting table 12. The electrostatic chuck 22 has a structure in which an upper disk-shaped member is stacked on a lower disciform member, where the diameter of the upper disciform member is smaller than that of the lower disciform member. The electrostatic chuck 22 is made of aluminum and ceramic or the like is sprayed at an upper surface. When mounting the wafer W of the mounting table 12, the wafer W is placed on the upper disciform member of the electrostatic chuck 22.

The DC power 23 is connected to the electrostatic electrode plate 21. When a positive direct current (hereinafter, referred to as "HV" (High Voltage) as well) is applied to the electrostatic electrode plate 21, negative electric potential is generated at a back surface (a surface at an electrostatic chuck 22 side) of the wafer W and an electric potential difference is generated between the electrostatic electrode plate 21 and the back surface of the wafer W. The wafer W is electrostatically adsorbed on the upper disciform member of the electrostatic chuck 22 due to the Coulomb force or Johnson-Rahbek force generated by the electric potential difference and is retained.

Further, the focus ring 24 is mounted on the electrostatic chuck 22 such that to surround a circumference portion of the wafer W. The focus ring 24 is made of a conductive member, silicon, for example, convergences the plasma to a front surface of the wafer W in the reaction room 17 and improves efficiency of the etching process.

Further, the coolant room 25 extends in a circumference direction and is provided inside the mounting table 12. A low temperature coolant, cooling water or GALDEN (registered trademark), for example, is circularly provided to the coolant room 25 from a chiller unit via a pipe 26 for coolant. The mounting table 12 cooled by such low temperature coolant cools the wafer W and the focus ring 24 via the electrostatic chuck 22.

The electrostatic chuck 22 is provided with a plurality of heat-transfer gas providing holes 27 at a surface (adsorbing surface) on which the wafer W is adsorbed on the upper disciform member. A heat-transfer gas such as a helium (He) gas is provided to the plurality of heat-transfer gas providing holes 27 via a heat-transfer gas providing line 28. The heat-transfer gas is provided to a gap between the adsorbing surface of the electrostatic chuck 22 and the back surface of the wafer W via the heat-transfer gas providing holes 27 to transmit the heat of the wafer W to the electrostatic chuck 22.

The gas shower head 29 is placed at a ceiling portion of the process chamber 11 such that to face the mounting table 12. The gas shower head 29 functions as a gas providing mechanism and an upper electrode. The gas shower head 29 includes a ceiling electrode plate 33 provided with a plurality of gas holes 32, a cooling plate 34 that detachably supports the ceiling electrode plate 33 and a cover body 35 that covers the cooling plate 34. Further, a buffer room 36 is provided in the cooling plate 34 and a gas introduction pipe 37 is connected to the buffer room 36. The gas shower head 29 provides the gas provided from the gas source 8 via the gas introduction pipe 37 and the buffer room 36 into the reaction room 17 via the plurality of the gas holes 32.

The gas shower head 29 is detachably attached to the process chamber 11 and functions as a cover of the process chamber 11. It is possible for an operator to directly touch the wall surface of the process chamber 11 or composing components when detaching the gas shower head 29 from the process chamber 11. With this configuration, the operator can clean the wall surface of the process chamber 11 or surfaces of the composing components and can remove adhered objects adhered on the wall surface of the process chamber 11 or the like.

In the plasma processing apparatus 10, plasma is generated from the gas provided from the gas shower head 29 and a plasma process such as etching or the like is performed on the wafer W by the plasma. Here, an operation of each of the composing components of the plasma processing apparatus 10 is controlled by the control unit 50 that controls the entirety of the plasma processing apparatus 10.

The control unit 50 includes a CPU 51, a ROM (Read Only Memory) 52 and a RAM (Random Access Memory) 53, and controls an etching process in accordance with steps set in a recipe stored in the RAM 53 or the like. Functions of the control unit 50 may be actualized by using software or hardware.

When performing a process such as etching in the plasma processing apparatus 10 structured as described above, first, the wafer W is carried in the process chamber 11 from the opened gate valve 9 under a condition being held on a transfer arm. After the wafer W is carried in, the gate valve 9 is closed. The wafer W is held by pusher pins above the electrostatic chuck 22, and is mounted on the electrostatic chuck 22 when the pusher pins move downward. The pressure in the process chamber 11 is reduced to a set value by the evacuation device 38. The gas is introduced into the process chamber 11 from the gas shower head 29 as a shower. The high frequency electric power of predetermined power is applied to the mounting table 12. Further, by applying voltage from the DC power 23 to the electrostatic electrode plate 21 of the electrostatic chuck 22, the wafer W can be electrostatically adsorbed on the electrostatic chuck 22.

Plasma is generated by ionizing and dissociating the introduced gas by the high frequency electric power. After plasma etching is performed on the wafer W by the plasma, the wafer W is held on the transfer arm and carried out from the process chamber 11. A next wafer W is similarly processed, and the plasma process is performed on a plurality of wafers W as such.

(Superimpose of High Frequency Electric Powers)

During the plasma process, the high frequency electric power for plasma excitation HF and the high frequency electric power for bias LF are applied on the mounting table 12. These high frequency electric powers are superimposed, and a standing wave is generated due to a high harmonics wave component of each of the high frequency electric powers. As a result, as illustrated in (a) of FIG. 2, which indicates an etching result of a silicon oxide film ($SiO_2$), for example, ER at the center portion (indicated as "C") of the wafer W becomes higher than ER at the middle portion (indicated as "M") or the edge portion (indicated as "E"). When the etching rate becomes uneven as such, process sizes of CD (Critical Dimension) or etching depths at the center portion and areas other than the center portion vary, and it becomes difficult to perform a uniform plasma process on the wafer W.

Figure 2:
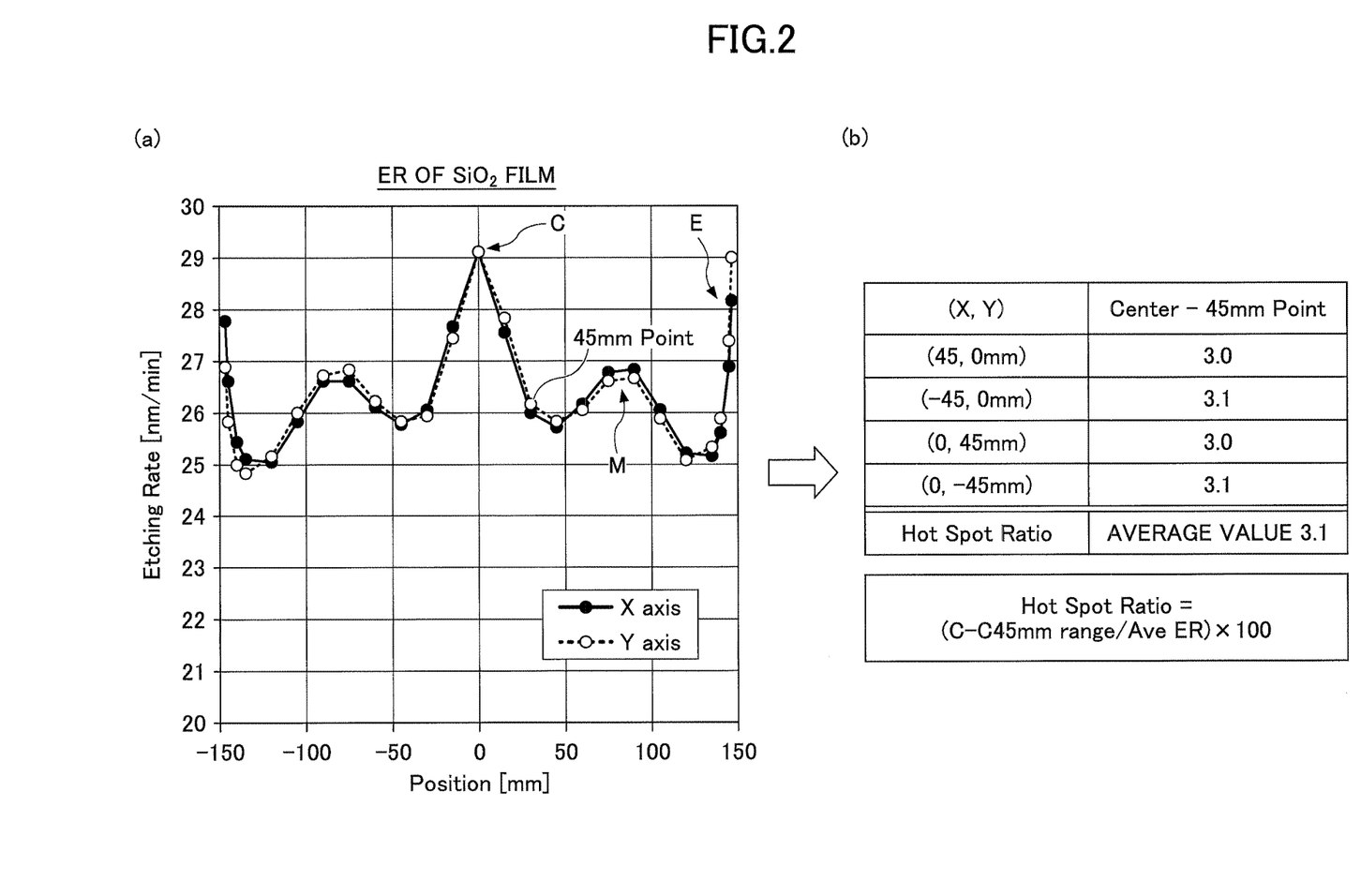
FIG. 2 is a view illustrating an example in which ER becomes higher at a center portion side due to superimpose of high frequency electric powers.

In particular, in etching using a polysilicon film as a mask, the process size of CD at the center portion may be different from the process size of CD at the middle portion or the edge portion. In such a case, it is preferable that the etching rate at the center portion of the wafer W is controlled, because desired etching can be performed and accuracy of microprocessing of the wafer W can be improved. In FIG. 2, (b) illustrates differences of ER between center (0 mm, 0 mm) of the center portion of the wafer W and four points shifted for ±45 mm in right, left, upper and lower directions (45 mm, 0 mm), (−45 mm, 0 mm), (0 mm, 45 mm), (0 mm, −45 mm), and their average value. The average value "3.1" of them is a hot spot ratio.

In a plasma processing method of the embodiment as will be explained below, the hot spot ratio is controlled to be less than or equal to "0". With this configuration, by controlling the etching rate of the center portion of the wafer W, generation of a standing wave of the two high frequency electric power HF and high frequency electric power LF applied in the process chamber 11 of the plasma processing apparatus 10 can be suppressed.

(Pulse Wave of High Frequency Electric Power)

According to the plasma processing method of the embodiment, pulse waves are used for the high frequency electric power for plasma excitation HF and the high frequency electric power for bias LF. Before explaining the plasma processing method of the embodiment, definition of a pulse wave of the high frequency electric power is simply explained.

Figure 3:
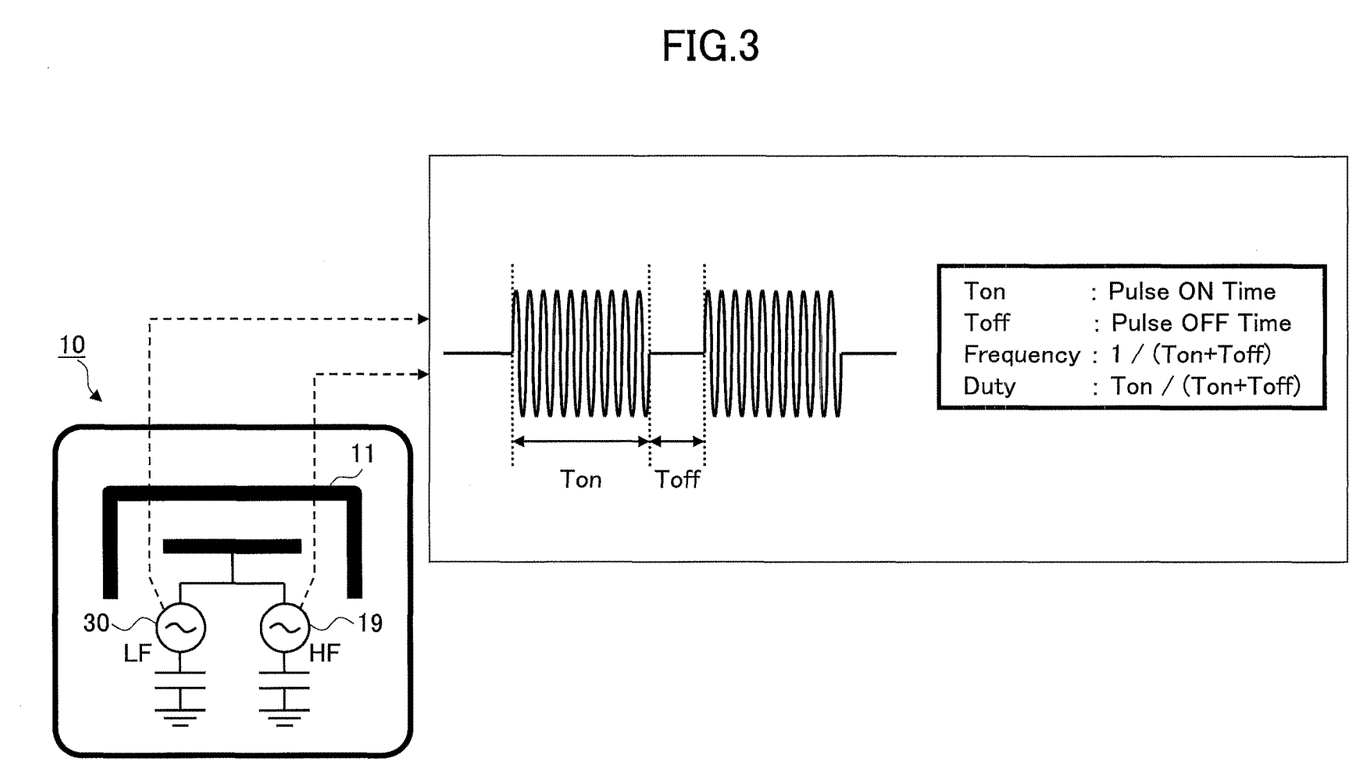
FIG. 3 is a view for explaining a pulse wave of high frequency electric power.

As illustrated in FIG. 3, when pulsed high frequency electric power is applied, it is assumed that the period when the high frequency electric power is applied on the mounting table 12 is "Ton" and the period when the high frequency electric power is not applied is "Toff". During the period "Ton" at which the high frequency electric power is applied, pulsed high frequency electric power whose Frequency F is 1/(Ton+Toff) is applied to the mounting table 12.

The "duty ratio" is expressed by a ratio of the period "Ton" at which the power is applied with respect to a total period of the period "Ton" and the period "Toff", in other words, Ton/(Ton+Toff).

(Synchronous Pulse Wave of High Frequency Electric Power)

Figure 4:
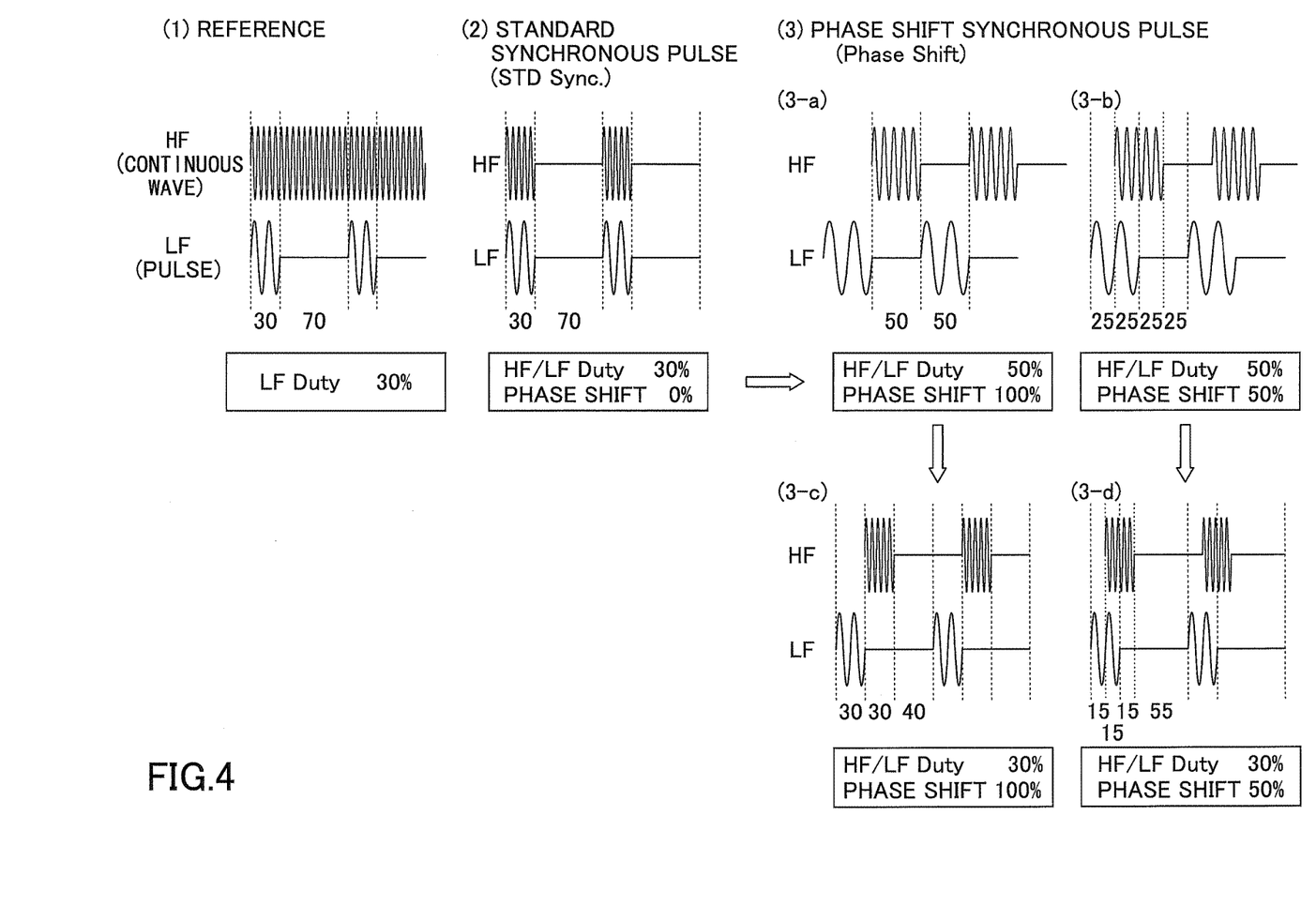
FIG. 4 is a view for explaining a method of applying high frequency electric power.

As illustrated in FIG. 4, in (1) reference, the high frequency electric power for plasma excitation HF is a continuous wave, not a pulse wave. The high frequency electric power for bias LF is a pulse wave whose duty ratio is 30%.

Compared with (1) reference, in (2) standard synchronous pulse, both the high frequency electric power HF and the high frequency electric power LF are pulse waves whose duty ratio is 30%, and the phase shift (phase difference) is 0%. As such, the "synchronous pulse of the high frequency electric power HF and the high frequency electric power LF" means pulse waves in which the frequencies and the duty ratios of the high frequency electric power HF and the high frequency electric power LF are the same. Here, the "Frequency F" here means frequency expressed by 1/(Ton+Toff) as illustrated in FIG. 3.

In (2) standard synchronous pulse, a phase difference is not generated for pulse waves of the high frequency electric power HF and the high frequency electric power LF. However, according to the plasma processing method of the embodiment, pulse waves of the high frequency electric power HF and the high frequency electric power LF are controlled such that a predetermined phase difference (not zero) is generated between the pulse wave of the high frequency electric power HF and the pulse wave of the high frequency electric power LF. For example, pulse waves of the high frequency electric power HF and the high frequency electric power LF are applied by the phase shift synchronous pulses as illustrated in (3). As an example, in the phase shift synchronous pulse of (3-a), it is controlled that the duty ratios of the high frequency electric power HF and the high frequency electric power LF are 50% and the phase shift of the high frequency electric power HF and the high frequency electric power LF is 100%. In the phase shift synchronous pulse of (3-b), it is controlled that the duty ratios of the high frequency electric power HF and the high frequency electric power LF are 50% and the phase shift of the high frequency electric power HF and the high frequency electric power LF is 50%. In the phase shift synchronous pulse of (3-c), it is controlled that the duty ratios of the high frequency electric power HF and the high frequency electric power LF are 30%, and the phase shift of the high frequency electric power HF and the high frequency electric power LF is 100%. In the phase shift synchronous pulse of (3-d), it is controlled that the duty ratios of the high frequency electric power HF and the high frequency electric power LF are 30%, and the phase shift of the high frequency electric power HF and the high frequency electric power LF is 50%.

(Experimental Result 1: Phase Synchronous Pulse)

Figure 5:
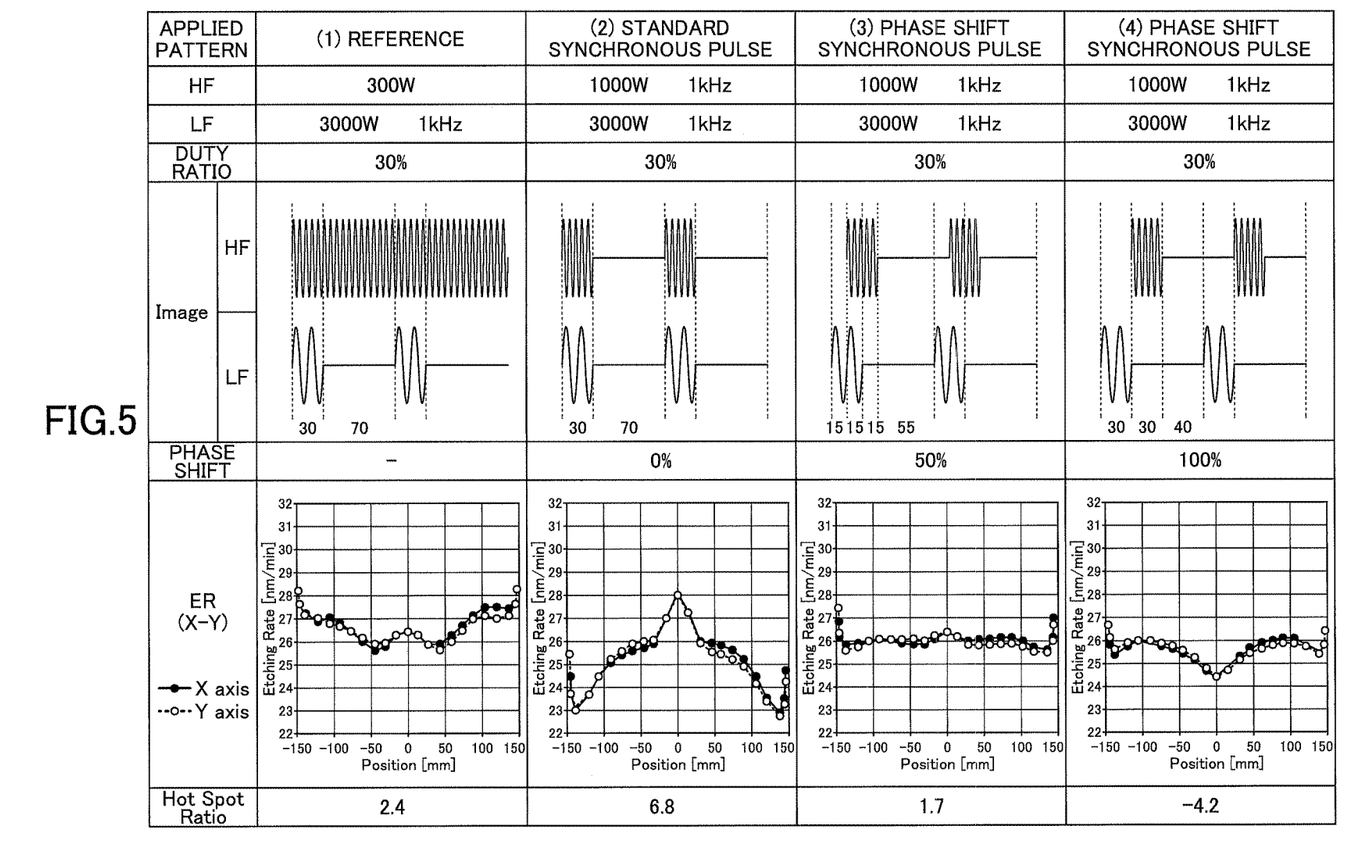
FIG. 5 is a view illustrating an experimental result 1 of a plasma processing method of the embodiment.

FIG. 5 illustrates an experimental result 1 in which the phase shift synchronous pulse waves of the high frequency electric power HF and the high frequency electric power LF are applied on the mounting table 12. In (3) and (4) of FIG. 5, results of ER by the phase shift synchronous pulses of the embodiment are illustrated. Further, results of ER of (1) reference and (2) standard synchronous pulse as are also illustrated in FIG. 5 as comparative examples.

Process conditions are as follows.

| (1) reference | |
|---|---|
| HF | 300 W (continuous wave) |
| LF | 3000 W (Frequency 1 kHz) |
| duty ratio (LF) | 30% |

-continued

| (2) standard synchronous pulse | |
|---|---|
| HF | 1000 W (Frequency 1 kHz) |
| LF | 3000 W (Frequency 1 kHz) |
| duty ratio (HF/LF) | 30% |
| phase shift | 0% |

| (3) phase shift synchronous pulse | |
|---|---|
| HF | 1000 W (Frequency 1 kHz) |
| LF | 3000 W (Frequency 1 kHz) |
| duty ratio (HF/LF) | 30% |
| phase shift | 50% |

| (4) phase shift synchronous pulse | |
|---|---|
| HF | 1000 W (Frequency 1 kHz) |
| LF | 3000 W (Frequency 1 kHz) |
| duty ratio (HF/LF) | 30% |
| phase shift | 100% |

For all of (1) to (4), etching was performed by mix gas containing hydrogen bromide gas (HBr), nitrogen trifluoride gas ($NF_3$) and oxygen ($O_2$) gas. The hot spot ratio calculated based on distribution of ER was 2.4 for (1) reference, 6.8 for (2) standard synchronous pulse, 1.7 for the phase shift synchronous pulse of (3) and −4.2 for the phase shift synchronous pulse of (4).

From these results, for the phase shift synchronous pulses of (3) and (4), the distribution of ER and the hot spot ratio were improved compared with (1) and (2). For example, for the phase shift synchronous pulse of (3), the distribution of ER was controlled to be flat among the center portion, the middle portion and the edge portion of the wafer W. Further, for the phase shift synchronous pulse of (4), the distribution of ER became a concaved shape where ER at the center portion of the wafer W became lower, and the center portion of the wafer W could be controlled by the phase shift amount (phase difference) of the high frequency electric powers. As indicated by these results, it was revealed that the generation of a standing wave of the high harmonics waves due to superimpose of the pulse waves of the high frequency electric power HF and the high frequency electric power LF could be prevented by controlling the phase shift amount (phase difference) of the phase synchronous pulses' of the high frequency electric power HF and the high frequency electric power LF. In other words, the phase shift amount (phase difference) of the phase synchronous pulses of the high frequency electric power HF and the high frequency electric power LF are controlled to generate a predetermined phase different capable of suppressing generation of a standing wave of high harmonics waves generated due to superimpose of the pulse waves. With this, the hot spot ratio of the center portion of the wafer W can be improved, and a uniform plasma process can be performed on the wafer W.

Here, according to the embodiment, the "phase shift amount" of the high frequency electric power HF and the high frequency electric power LF means a shift amount of phases of the high frequency electric power HF and the high frequency electric power LF. For example, when the high frequency electric power HF and the high frequency electric power LF are completely overlapped, the phase shift amount is 0%. When the high frequency electric power HF and the high frequency electric power LF are half overlapped, the phase shift amount is 50%. When the high frequency electric power HF and the high frequency electric power LF are not overlapped at all, if the high frequency electric power HF is applied first, the phase shift amount is −100%, and if the high frequency electric power LF is applied first, the phase shift amount is 100%.

(Experimental Result 2: Phase Shift Amount)

Figure 6:
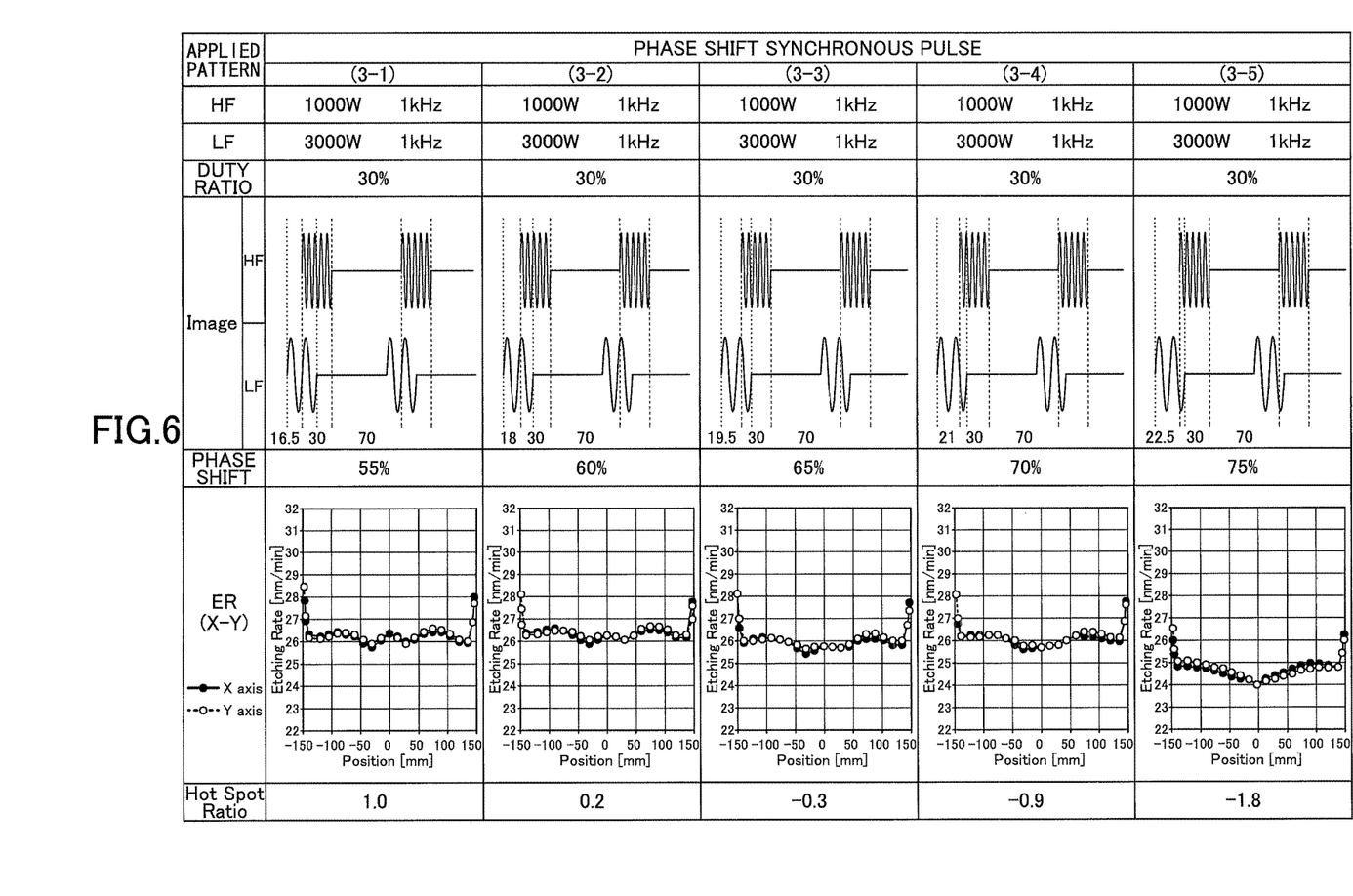
FIG. 6 is a view illustrating an experimental result 2 of the plasma processing method of the embodiment.

FIG. 6 illustrates an experimental result 2 in which the phase shift amount of the phase shift synchronous pulse waves of the high frequency electric power HF and the high frequency electric power LF was varied in etching.

Process conditions are as follows.

| (3-1) to (3-5) phase shift synchronous pulse | |
|---|---|
| HF | 1000 W (Frequency 1 kHz) |
| LF | 3000 W (Frequency 1 kHz) |
| duty ratio | 30% |
| phase shift | variable (55% to 75%) |

For all of the above cases, etching was performed by mix gas containing HBr gas, $NF_3$ gas and $O_2$ gas. FIG. 6 illustrates the distribution of ER and the hot spot ratio for each of the above cases. From these results, the hot spot ratio was improved most and the distribution of ER became uniform for (3-2) in which the phase shift was 60% and (3-3) in which the phase shift was 65%. As indicated by these results, it was revealed that the hot spot ratio of the center portion of the wafer W could be controlled by controlling the phase shift amount of the phase shift synchronous pulses.

(Experimental Result 3: Duty Ratio)

Figure 7:
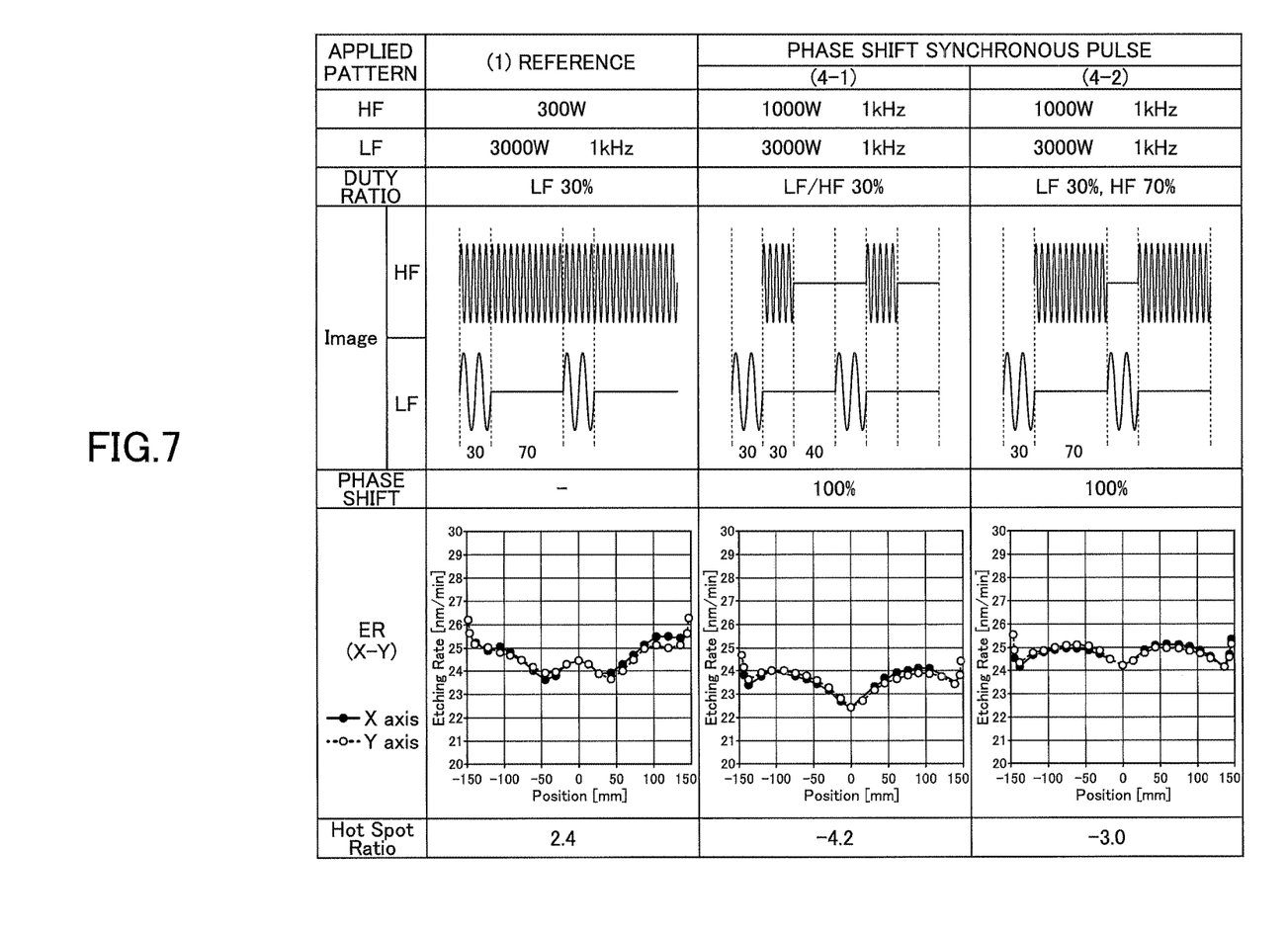
FIG. 7 is a view illustrating an experimental result 3 of the plasma processing method of the embodiment.

FIG. 7 illustrates an experimental result 3 in which the duty ratio of the phase shift synchronous pulse waves of the high frequency electric power HF and the high frequency electric power LF was varied in etching. In (4-1) and (4-2) of FIG. 7, results of ER by the phase shift synchronous pulses of the embodiment are illustrated. Further, a result of ER of (1) reference is illustrated in FIG. 7 as a comparative example.

Process conditions are as follows.

| (1) reference | |
|---|---|
| HF | 300 W (continuous wave) |
| LF | 3000 W (Frequency 1 kHz) |
| duty ratio | 30% |

| (4-1) phase shift synchronous pulse | |
|---|---|
| HF | 1000 W (Frequency 1 kHz) |
| LF | 3000 W (Frequency 1 kHz) |
| duty ratio | 30% |
| phase shift | 100% |

| (4-2) phase shift synchronous pulse | |
|---|---|
| HF | 1000 W (Frequency 1 kHz) |
| LF | 3000 W (Frequency 1 kHz) |
| duty ratio | LF 30%, HF 70% |
| phase shift | 100% |

For all of (1), (4-1) and (4-2), etching was performed by mix gas containing HBr gas, $NF_3$ gas and $O_2$ gas. FIG. 7 illustrates the distribution of ER and the hot spot ratio for each of the above cases.

From these results, it was revealed that, in particular, ER of the middle portion could be increased while retaining the distribution of ER to be a concaved shape where ER at the center portion of the wafer W became lower, by varying the duty ratio of the high frequency electric power HF from 30% to 70%. It is considered that by increasing the duty ratio of the high frequency electric power HF from 30% to 70%, the period at which the high frequency electric power HF for plasma generation is applied becomes longer for 40%, the density of plasma is increased and the middle portion can be controlled.

On the other hand, as density of plasma is not increased even when the duty ratio of the high frequency electric power for bias LF is increased, it is difficult to control the middle portion. Thus, if the duty ratio of the high frequency electric power LF is higher than the duty ratio of the high frequency electric power HF, ER is lowered and it is difficult to control the middle portion. Thus, it was revealed that the ER of the middle portion could be controlled by setting the duty ratio of the high frequency electric power HF to be greater than or equal to the duty ratio of the high frequency electric power LF.

From above results, the distribution of ER can be a concaved shape at the center portion of the wafer W by controlling the phase shift amount (phase difference) of the high frequency electric power HF and the high frequency electric power LF. In other words, generation of a standing wave of the high harmonics waves due to superimpose of pulses of the high frequency electric power HF and the high frequency electric power LF can be prevented.

In addition, ER of the middle portion can be controlled by controlling the duty ratio of the high frequency electric power HF under a condition that the duty ratio of the high frequency electric power HF≥ the duty ratio of the high frequency electric power LF. As a high harmonics wave is hardly generated at the edge portion, the wafer W can be uniformly etched by controlling ERs at the center portion and the middle portion.

Further, according to the embodiment, the frequency of the high frequency electric power HF for plasma generation is 100 MHz, and the frequency of the high frequency electric power for bias LF is 13.56 MHz. However, the frequency of the high frequency electric power HF and the frequency of the high frequency electric power LF are not limited so. For example, the frequency of the high frequency electric power HF may be within a range of 100 MHz to 150 MHz, and the frequency of the high frequency electric power LF may be within a range of 400 kHz to 13.56 MHz.

Further, the mix gas containing HBr gas, $NF_3$ gas and $O_2$ gas is exemplified as the etching gas in the embodiment. However, the etching gas is not limited so and mix gas containing HBr gas, CF based gas and $O_2$ gas may be used. Furthermore, $N_2$ gas or mix gas of $O_2$ gas and $N_2$ gas may be used instead of $O_2$ gas in the etching gas.

(Example of Etching Shape of Experimental Result)

Figure 8:
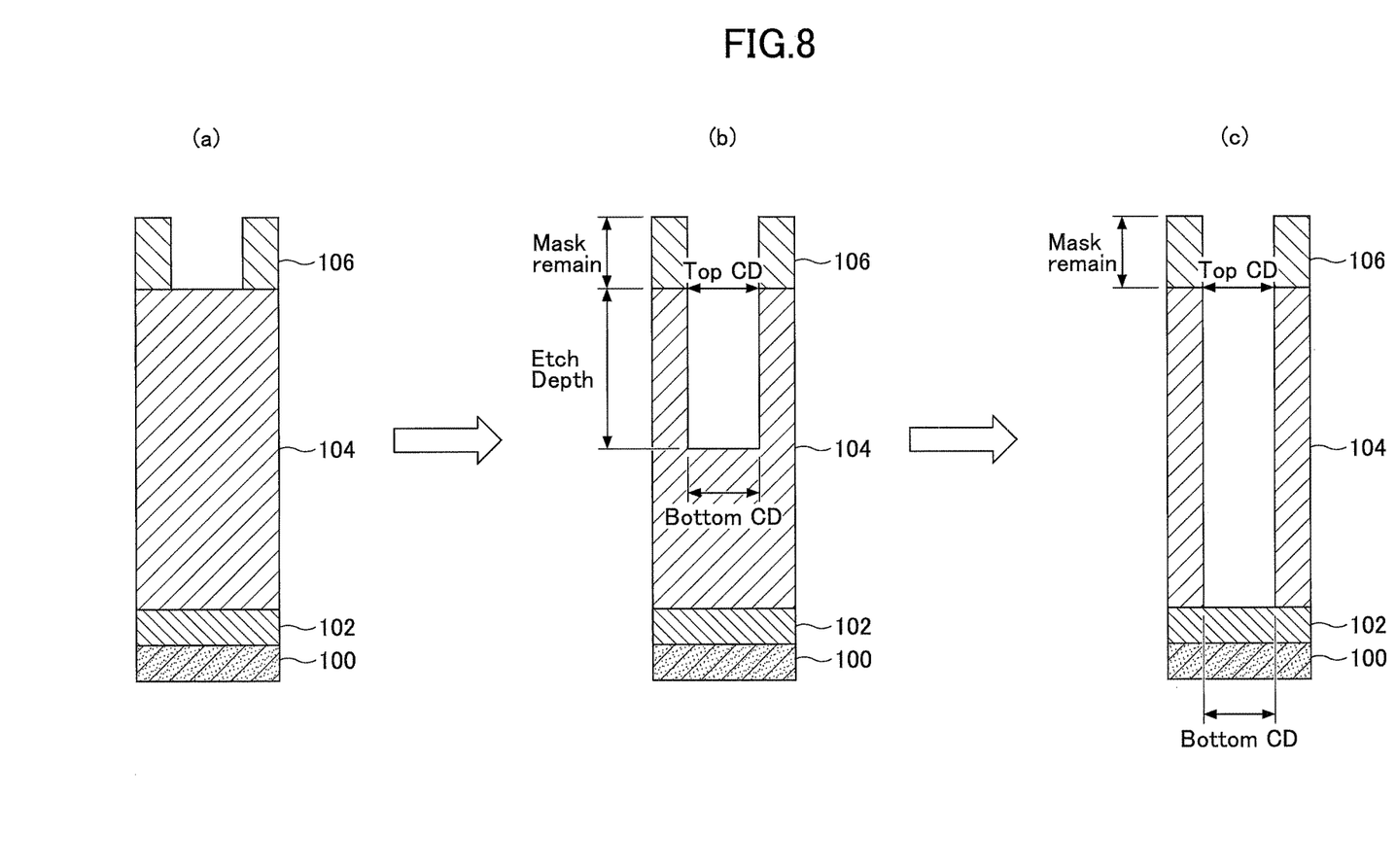
FIG. 8 is a view illustrating an example of a stacked film to be etched of the embodiment.
Figure 9:
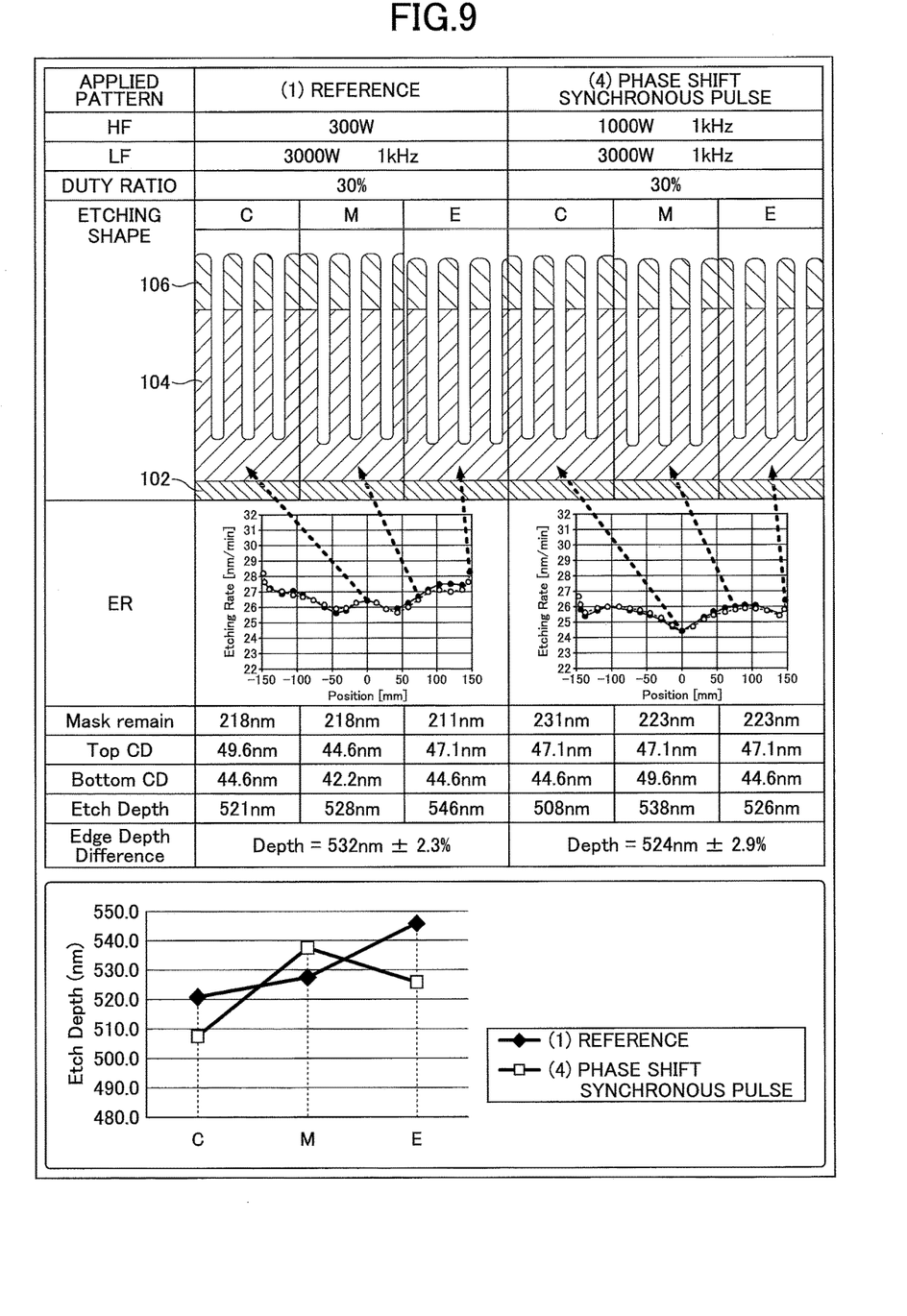
FIG. 9 is a view illustrating an example of a partial etching result by the plasma processing method of the embodiment.
Figure 10:
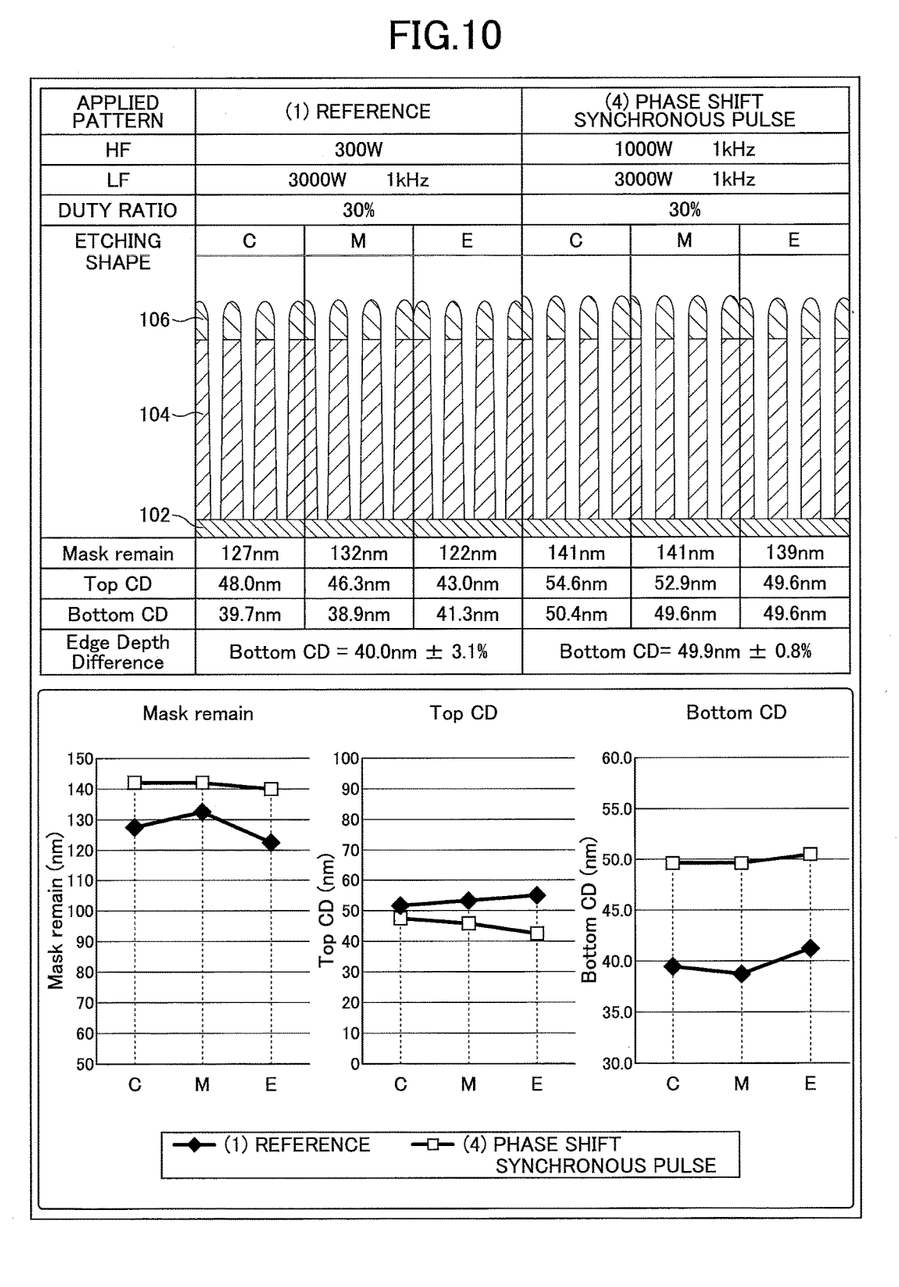
FIG. 10 is a view illustrating an example of a full etching result by the plasma processing method of the embodiment.

An example of an etching shape of an experimental result of the embodiment is explained with reference to FIG. 8 to FIG. 10. FIG. 8 illustrates an example of a stacked film to be etched of the embodiment. FIG. 9 illustrates an example of an etching shape after partial etching is performed by the plasma processing method of the embodiment. FIG. 10 illustrates an example of an etching shape after full etching is performed by the plasma processing method of the embodiment.

As illustrated in (*a*) of FIG. 8, the stacked film to be etched of the embodiment has a stacked structure of a thermal silicon oxide film 102, a polysilicon film 104 and a silicon oxide film 106 in this order on a silicon substrate (Si) 100.

In FIG. 8, (*b*) is a view schematically illustrating an etching shape after a partial etching is performed by the plasma processing method of the embodiment. In the partial etching, the polysilicon film 104 is etched in the middle using the silicon oxide film 106 as a mask. In FIG. 8, (*c*) is a view schematically illustrating an etching shape after a full etching is performed by the plasma processing method of the embodiment. In the full etching, the polysilicon film 104 is further etched to expose the thermal silicon oxide film 102 using the silicon oxide film 106 as a mask from the partial etching illustrated in (*b*) of FIG. 8.

FIG. 9 illustrates an example of a result after the partial etching is performed. Process conditions are as follows.

| (1) reference | |
| --- | --- |
| HF | 300 W (continuous wave) |
| LF | 3000 W (Frequency 1 kHz) |
| duty ratio (LF) | 30% |
| (4) phase shift synchronous pulse | |
| HF | 1000 W (Frequency 1 kHz) |
| LF | 3000 W (Frequency 1 kHz) |
| duty ratio (HF/LF) | 30% |
| phase shift | 100% |

For all of (1) and (4), etching was performed by mix gas containing HBr gas, $NF_3$ gas and $O_2$ gas. As illustrated in a result of ER in FIG. 9, for the phase shift synchronous pulse of (4), the distribution of ER became a concaved shape where ER at the center portion of the wafer W became lower. It can be understood that the center portion of the wafer W can be controlled by the phase shift amount of the high frequency electric powers HF and LF. As a result, as illustrated in a graph of Etch Depth and cross sections of the etching shape in FIG. 9, for the phase shift synchronous pulse of (4), etch depth of the middle portion of the polysilicon film 104 is deeper than that of (1) reference. This means that for the phase shift synchronous pulse of (4), the middle portion of the wafer W can be more controlled compared with a case of (1) reference.

Further, for the phase shift synchronous pulse of (4), mask residue (mask remain) of the silicon oxide film 106 is greater than that of (1) reference. The greater the mask residue, the slower the ER is. In particular, for the phase shift synchronous pulse of (4), mask residue at the center portion is greater than mask residue at the middle portion. Thus, according to the embodiment, it is possible to control the ERs at the center portion and the middle portion to be the same by increasing controllability of the middle portion in addition to increasing controllability of the center portion.

FIG. 10 illustrates an example of a result after the full etching is performed. Process conditions are the same as those explained above for the partial etching.

As illustrated in a result of mask residue in FIG. 10, for the phase shift synchronous pulse of (4), mask residue of the silicon oxide film 106 is greater than that of (1) reference. In particular, for the phase shift synchronous pulse of (4), compared with (1) reference in which the mask residue of the center portion is less than mask residue of the middle portion, mask residue of the center portion is the same as mask residue of the middle portion. With this configuration, it can be understood that the ER at center portion and the middle portion are controlled to be the same according to the result after full etching as well. As such, according to the embodiment, controllability of the middle portion, not only for the center portion can be increased.

Further, for the phase shift synchronous pulse of (4), compared with (1) reference, a difference between the bottom CD with respect to the TOP CD is small. Thus, it can be understood that for the phase shift synchronous pulse of (4), the etching shape is straight and an appropriate etching is performed. In particular, for the phase shift synchronous pulse of (4), bottom CD at the middle portion is good and it can be understood that etching at the middle portion is controlled according to the result after the full etching as well.

As described above, according to the plasma processing method by the phase shift synchronous pulse of the embodiment, as the center portion and the middle portion can be controlled, it is revealed that an appropriate etching result is obtained where the etching depth is deep and etching shape is straight.

As described above, according to the plasma processing method, by applying pulsed high frequency electric powers HF and LF, and controlling the phase shift amount of the high frequency electric powers, generation of a standing wave due to high harmonics waves can be suppressed, and hot spot of the center portion of the wafer W can be suppressed.

Further, by controlling the duty ratio of the high frequency electric powers in addition to shifting the phases of the pulsed high frequency electric powers HF and LF, controllability of the middle portion of the wafer W can be increased. With this, according to the plasma processing method of the embodiment, etching with desired etching characteristics can be performed on the wafer W.

According to the embodiment, a technique to suppress generation of a standing wave of a plurality of high frequency electric powers applied in a process chamber of a plasma processing apparatus is provided.

Although a preferred embodiment of the plasma processing method and the plasma processing apparatus has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, the plasma processing method of the embodiment is applicable not only to the Parallel Plate Capacitively Coupled Plasma (CCP) apparatus as explained above in the embodiment, but also to other plasma processing apparatuses. As the other plasma processing apparatuses, an Inductively Coupled Plasma (ICP) apparatus, a plasma processing apparatus using a radial line slot antenna, a Helicon Wave Plasma (HWP) apparatus, an Electron Cyclotron Resonance Plasma (ECR) apparatus or the like may be raised.

Further, the substrate processed by the plasma processing method of the embodiment is not limited to a wafer, and may be a large-size substrate for a Flat Panel Display, or a substrate for an EL element or for a photovoltaic cell, for example.

What is claimed is:

1. A plasma processing method using a plasma processing apparatus including
   a process chamber,
   a mounting table provided in the process chamber, and
   an electrode provided to face the mounting table, of plasma processing a substrate on the mounting table, the method comprising:
   applying a pulse wave of high frequency electric power for plasma generation and a pulse wave of high frequency electric power for bias whose frequency is lower than that of the high frequency electric power for plasma generation on the mounting table;
   controlling the pulse wave of the high frequency electric power for plasma generation and the pulse wave of the high frequency electric power for bias such that a predetermined phase difference is generated between the pulse wave of the high frequency electric power for plasma generation and the pulse wave of the high frequency electric power for bias, and a duty ratio of the high frequency electric power for plasma generation becomes greater than or equal to a duty ratio of the high frequency electric power for bias; and
   etching the substrate on the mounting table under a condition controlled in the controlling,
   wherein in the controlling, the pulse wave of the high frequency electric power for plasma generation and the pulse wave of the high frequency electric power for bias are controlled to generate the predetermined phase difference capable of suppressing generation of a standing wave of high harmonics waves generated due to the superimposition of the pulse waves,
   wherein in the controlling, the duty ratio of the high frequency electric power for plasma generation is set greater than the duty ratio of the high frequency electric power for bias to a degree capable of selectively increasing an etching rate at a middle portion of the substrate between a center portion and an edge portion of the substrate.

2. The plasma processing method according to claim 1, further comprising:
   providing gas containing hydrogen bromide (HBr) gas, nitrogen trifluoride ($NF_3$) gas and oxygen ($O_2$) gas, or gas containing hydrogen bromide gas, CF based gas and oxygen gas in the process chamber, and etching a polysilicon film formed on the substrate using a silicon oxide film formed on the polysilicon film as a mask.

3. The plasma processing method according to claim 1, wherein frequency of the high frequency electric power for plasma generation is within a range of 100 MHz to 150 MHz and frequency of the high frequency electric power for bias is within range of 400 kHz to 13.56 MHz.

4. The plasma processing method according to claim 1, wherein in the controlling, the duty ratio of the high frequency electric power for plasma generation is set greater than or equal to two times of the duty ratio of the high frequency electric power for bias.

* * * * *